US012682574B2

(12) United States Patent
Hasebe et al.

(10) Patent No.: US 12,682,574 B2
(45) Date of Patent: Jul. 14, 2026

(54) ANNOTATION DEVICE AND ANNOTATION METHOD

(71) Applicant: Hitachi, Ltd., Tokyo (JP)

(72) Inventors: Tatsuya Hasebe, Tokyo (JP); Erika Watanabe, Tokyo (JP); Makoto Onodera, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 177 days.

(21) Appl. No.: 18/699,756

(22) PCT Filed: Nov. 4, 2022

(86) PCT No.: PCT/JP2022/041111
§ 371 (c)(1),
(2) Date: Apr. 9, 2024

(87) PCT Pub. No.: WO2023/100587
PCT Pub. Date: Jun. 8, 2023

(65) Prior Publication Data
US 2024/0412461 A1 Dec. 12, 2024

(30) Foreign Application Priority Data
Nov. 30, 2021 (JP) ................................. 2021-193891

(51) Int. Cl.
*G06T 19/00* (2011.01)
*G06F 30/12* (2020.01)
*G06T 7/50* (2017.01)

(52) U.S. Cl.
CPC .............. *G06T 19/00* (2013.01); *G06F 30/12* (2020.01); *G06T 7/50* (2017.01);
(Continued)

(58) Field of Classification Search
CPC . G06T 19/00; G06T 7/50; G06T 2207/20081; G06T 2207/20092;
(Continued)

(56) References Cited

U.S. PATENT DOCUMENTS

| | | | |
|---|---|---|---|
| 2005/0093860 A1 | 5/2005 | Yanagisawa et al. | |
| 2010/0031135 A1 | 2/2010 | Naghshin et al. | |

(Continued)

FOREIGN PATENT DOCUMENTS

| | | | |
|---|---|---|---|
| JP | 2005-141671 A | 6/2005 | |
| JP | 2018-180578 A | 11/2018 | |

(Continued)

OTHER PUBLICATIONS

International Search Report (PCT/ISA/210) issued in PCT Application No. PCT/JP2022/041111 dated Jan. 24, 2023 (2 pages).
(Continued)

*Primary Examiner* — Haixia Du
(74) *Attorney, Agent, or Firm* — Crowell & Moring LLP

(57) ABSTRACT

Provided are an annotation device and an annotation method capable of simple and highly accurate annotation. An annotation device for annotation to 3D shape data and implemented using a computer, the annotation device including: an input unit that inputs a 3D CAD model, a text, and label definition information; a calculation unit that generates an annotation data set through annotation processing; a storage unit that stores the generated annotation data set; and an output unit that outputs a processing result of the calculation unit, in which the calculation unit includes an annotation unit that obtains a partial shape of the 3D CAD model and annotation information including a label according to a named entity in the text or the label definition information, and a metadata generation unit that generates metadata that associates the annotation information with partial shapes of
(Continued)

the 3D CAD model and heterogeneous format data derived from the 3D CAD model, and stores an annotation data set including the generated metadata, and a 3D CAD model and a text referenced by the metadata in the storage unit.

9 Claims, 10 Drawing Sheets

(52) U.S. Cl.
CPC .............. *G06T 2207/20081* (2013.01); *G06T 2207/20092* (2013.01); *G06T 2210/32* (2013.01); *G06T 2219/004* (2013.01)

(58) Field of Classification Search
CPC ........... G06T 2210/32; G06T 2219/004; G06F 30/12; G06F 30/00; G06F 30/10; G06F 30/27
See application file for complete search history.

(56) References Cited

U.S. PATENT DOCUMENTS

| | | | |
|---|---|---|---|
| 2018/0285511 A1 | 10/2018 | Demizu et al. | |
| 2018/0315237 A1* | 11/2018 | Byers | G06T 19/00 |
| 2019/0347312 A1* | 11/2019 | Kondo | G06F 40/106 |
| 2019/0354639 A1 | 11/2019 | Wu et al. | |

FOREIGN PATENT DOCUMENTS

| | | |
|---|---|---|
| JP | 2019-204506 A | 11/2019 |
| JP | 2020-95378 A | 6/2020 |

OTHER PUBLICATIONS

Japanese-language Written Opinion (PCT/ISA/237) issued in PCT Application No. PCT/JP2022/041111 dated Jan. 24, 2023 with English translation (7 pages).

* cited by examiner

[FIG. 1]
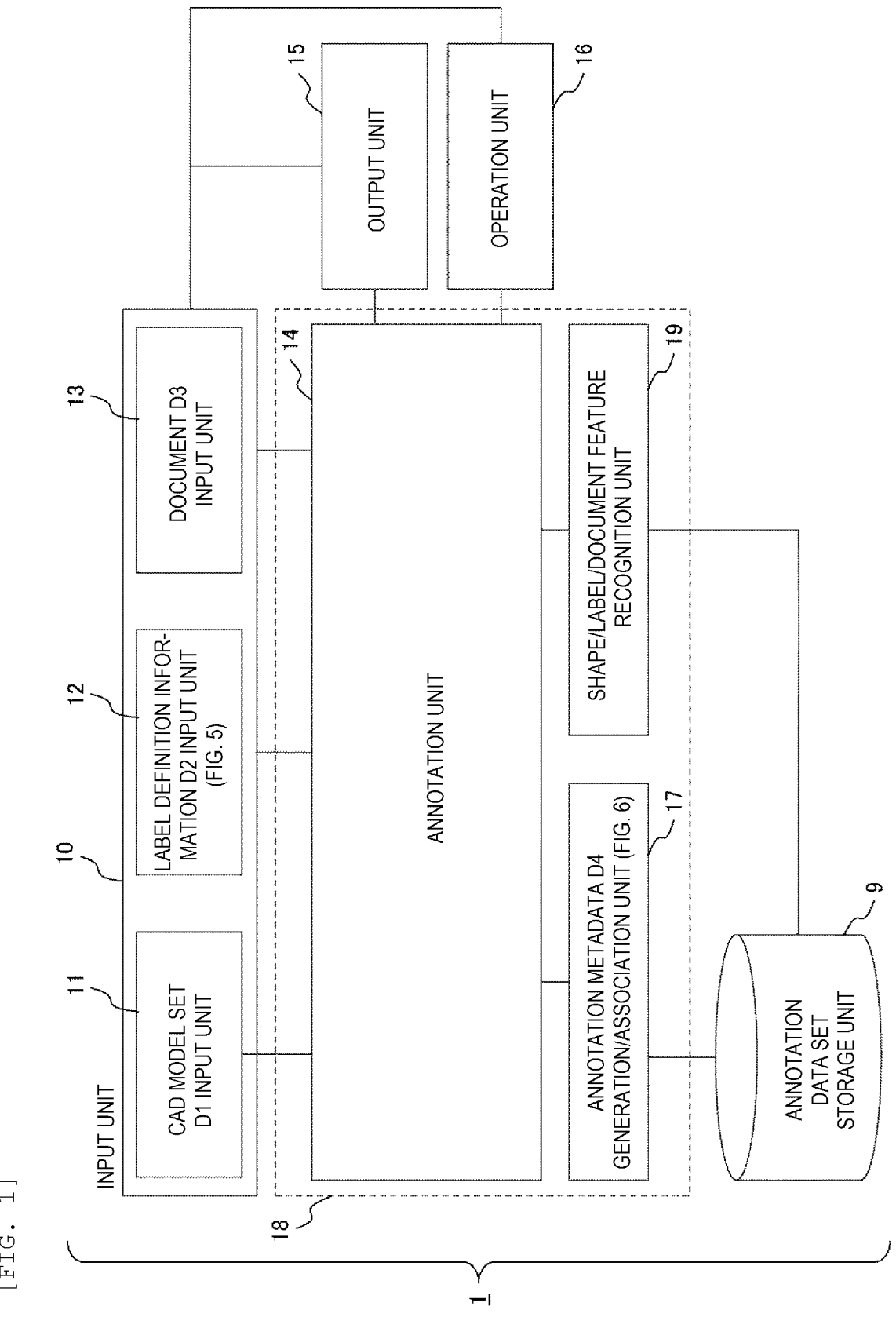

[FIG. 2]
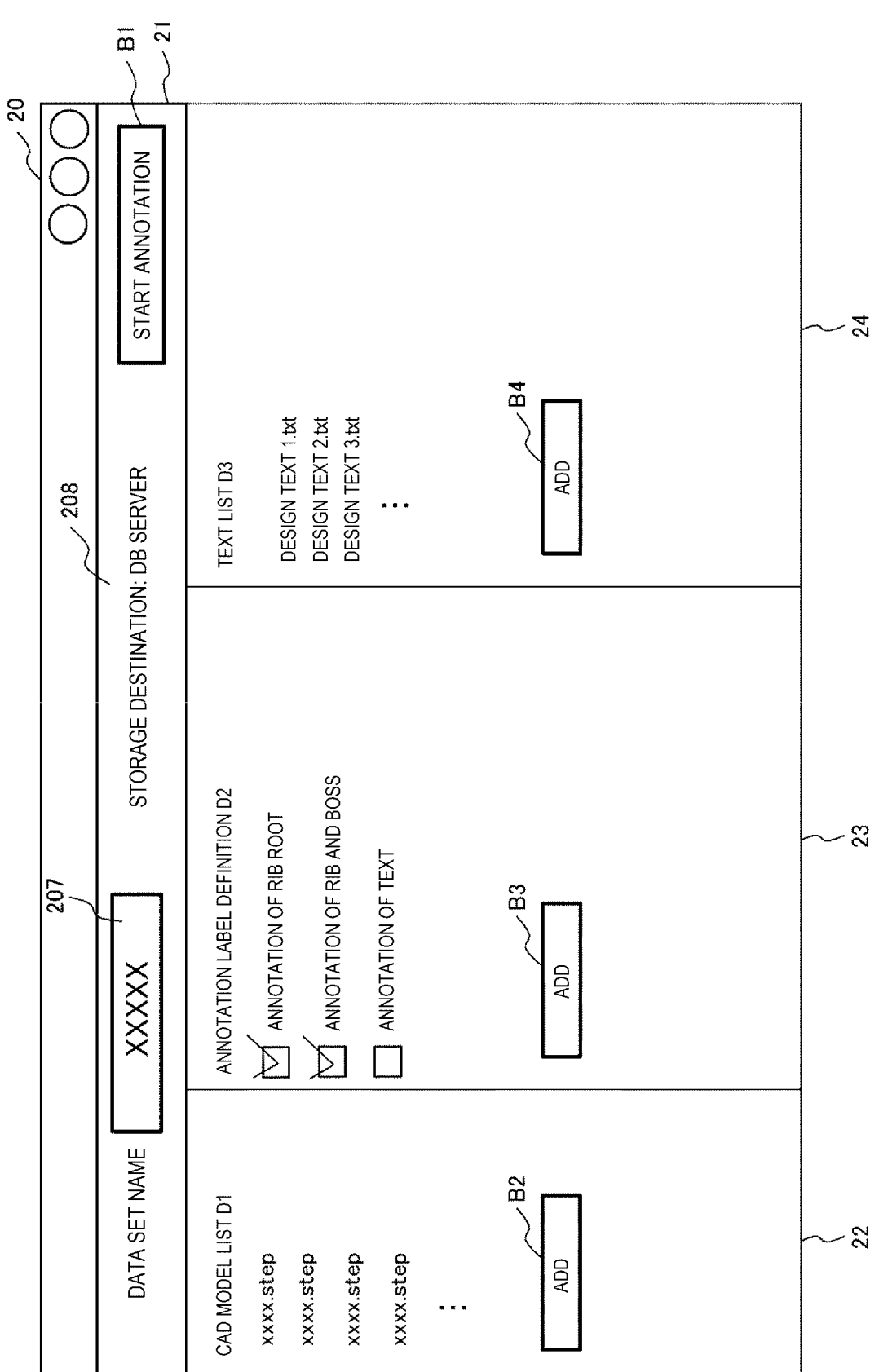

[FIG. 3]
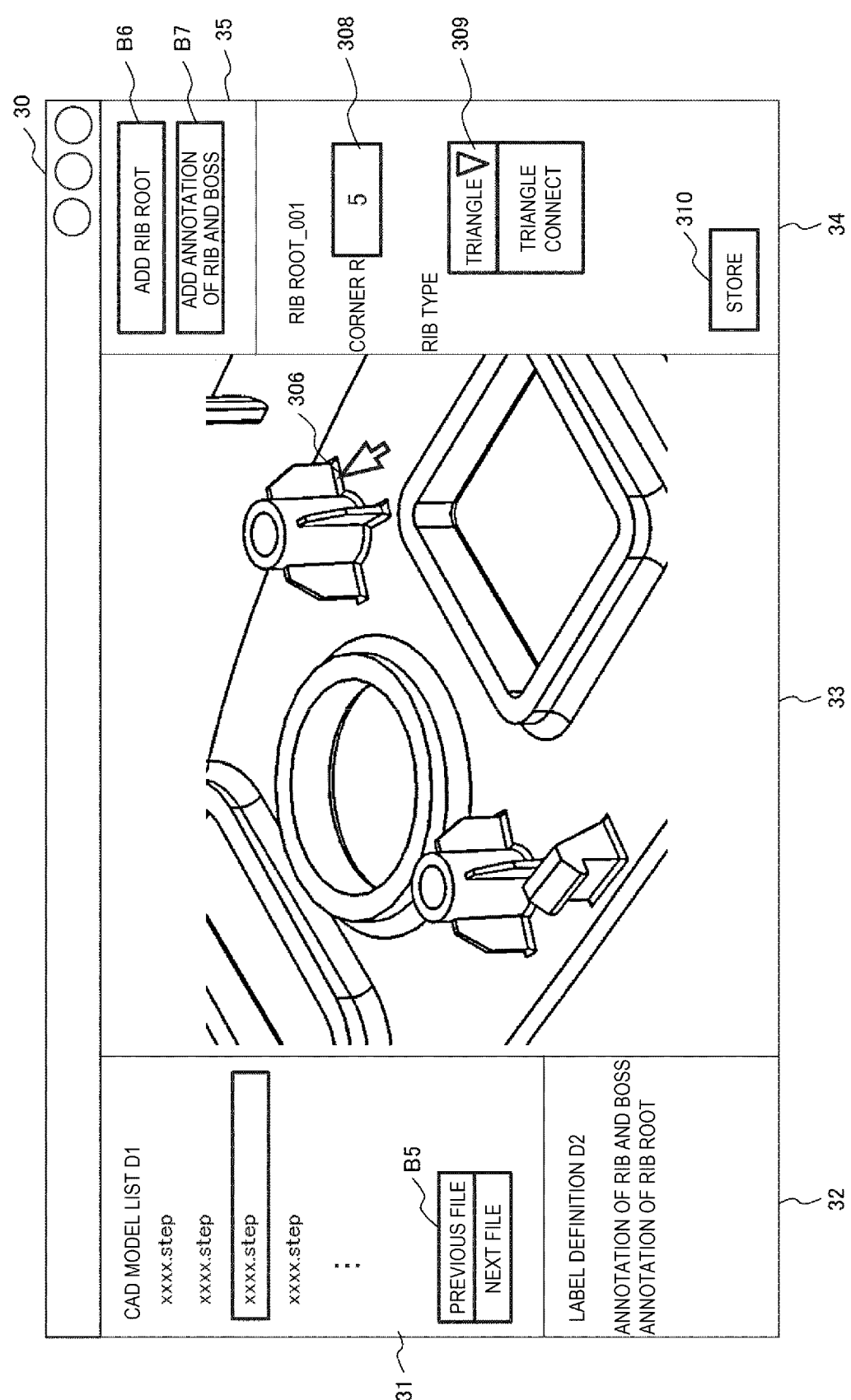
CAD MODEL LIST D1
xxxx.step
xxxx.step
xxxx.step
xxxx.step
...
PREVIOUS FILE    B5
NEXT FILE
LABEL DEFINITION D2
ANNOTATION OF RIB AND BOSS
ANNOTATION OF RIB ROOT
32
31
ADD RIB ROOT    B6
ADD ANNOTATION
OF RIB AND BOSS    B7
35
RIB ROOT_001
CORNER R    5    308
RIB TYPE
TRIANGLE ▷    309
TRIANGLE
CONNECT
STORE    310
34
33
306
30

[FIG. 4]
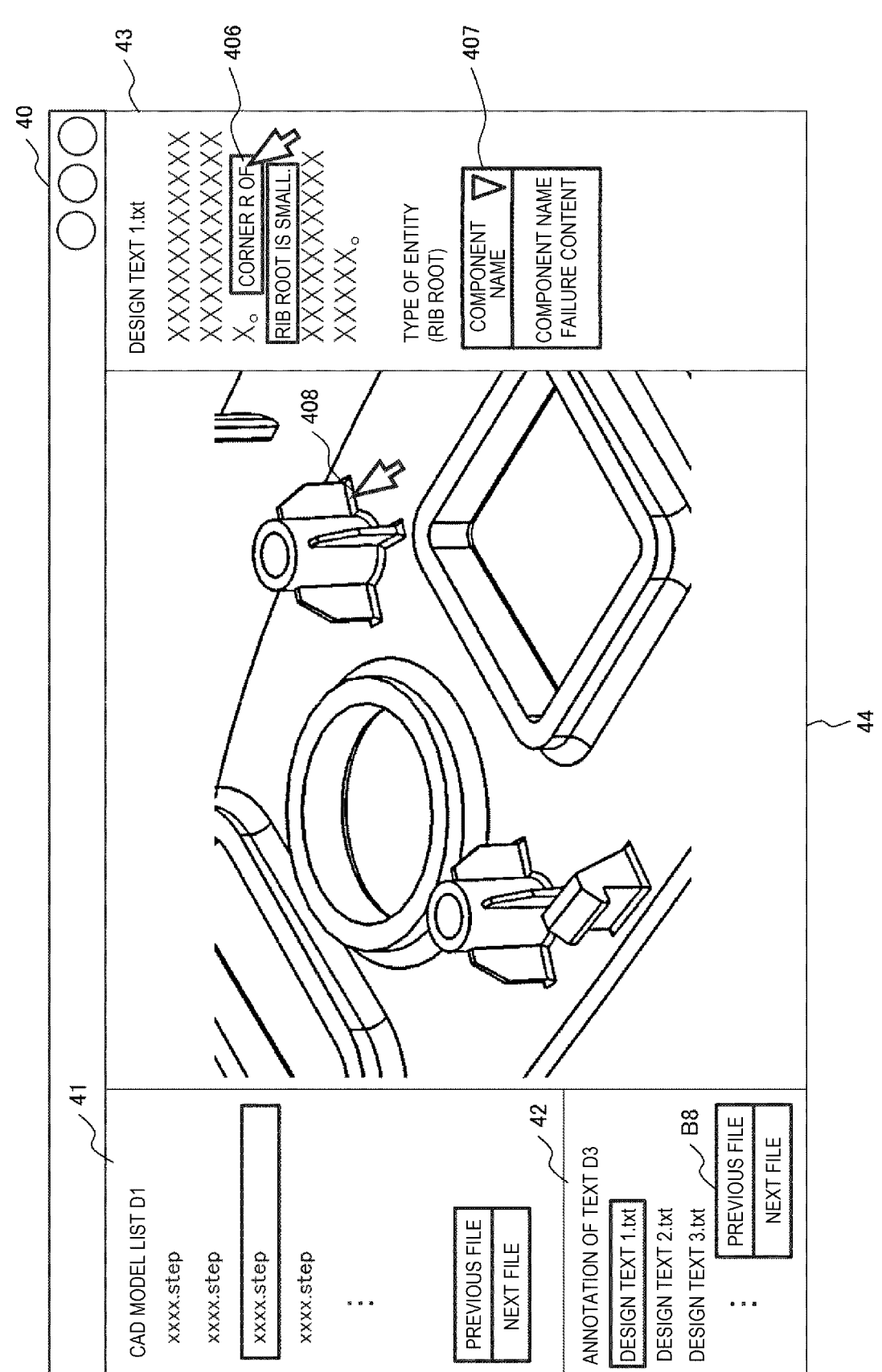

```
name: "ANNOTATION OF RIB AND BOSS"
target: surfaces
label_definition: {
    "SHAPE TYPE": choice("RIB", "BOSS", ...)
    "SHAPE NAME": string,
    "DIMENSION": float(0, 10),
    "DESIGN FAILURE": bool,
    ...
}
```

502

```
name: "ANNOTATION OF RIB ROOT"
target: edges | surfaces
label_definition: {
    "CORNER R": float(0, 100),
    "RIB TYPE": choice("TRIANGLE", "CONNECT", ...),
}
```

503

```
name: "ANNOTATION OF TEXT"
target: text
entities: [
    "COMPONENT NAME", "FAILURE CONTENT"
]
```

[FIG. 6]

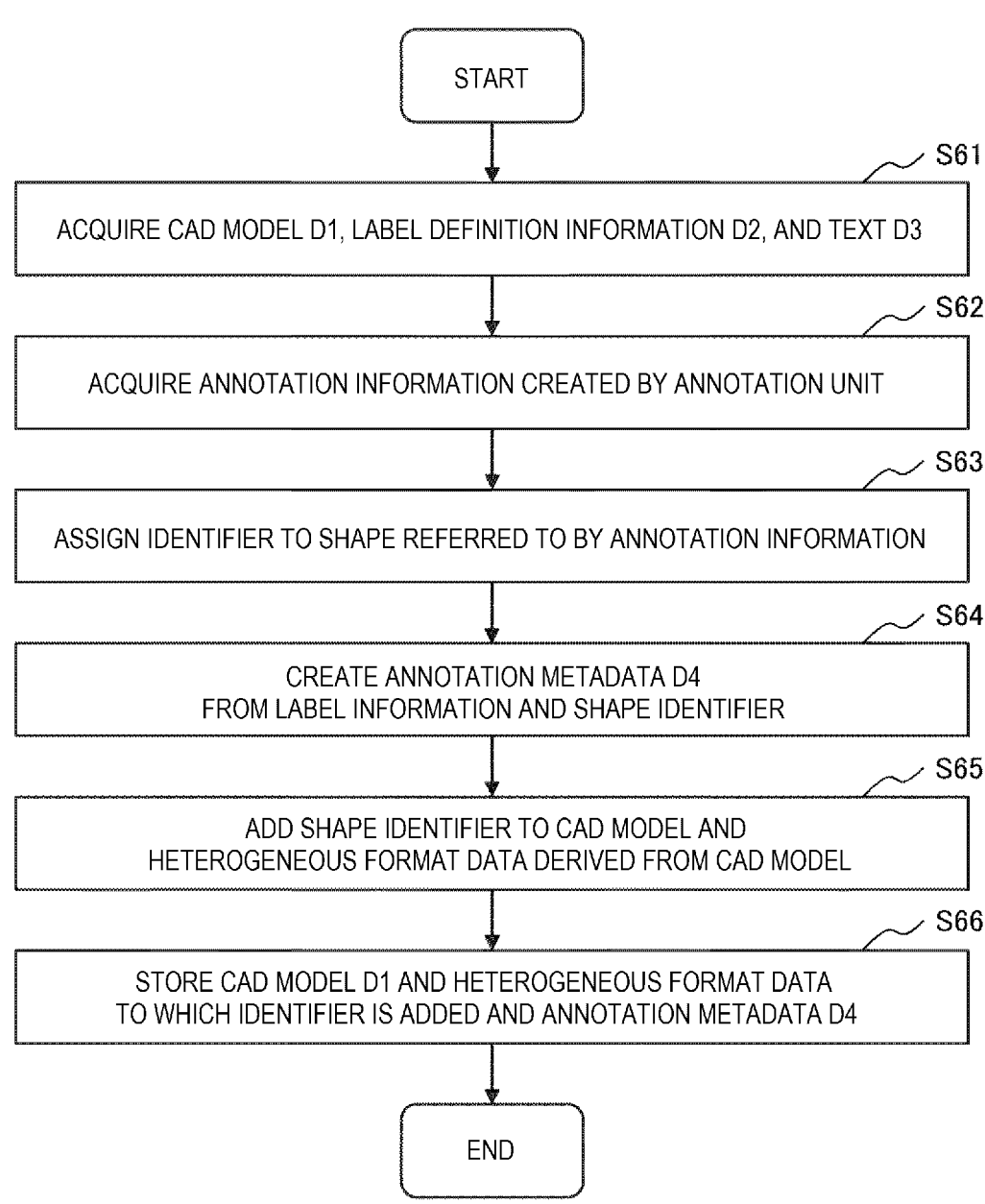

START

S61

ACQUIRE CAD MODEL D1, LABEL DEFINITION INFORMATION D2, AND TEXT D3

S62

ACQUIRE ANNOTATION INFORMATION CREATED BY ANNOTATION UNIT

S63

ASSIGN IDENTIFIER TO SHAPE REFERRED TO BY ANNOTATION INFORMATION

S64

CREATE ANNOTATION METADATA D4
FROM LABEL INFORMATION AND SHAPE IDENTIFIER

S65

ADD SHAPE IDENTIFIER TO CAD MODEL AND
HETEROGENEOUS FORMAT DATA DERIVED FROM CAD MODEL

S66

STORE CAD MODEL D1 AND HETEROGENEOUS FORMAT DATA
TO WHICH IDENTIFIER IS ADDED AND ANNOTATION METADATA D4

END

[FIG. 7]

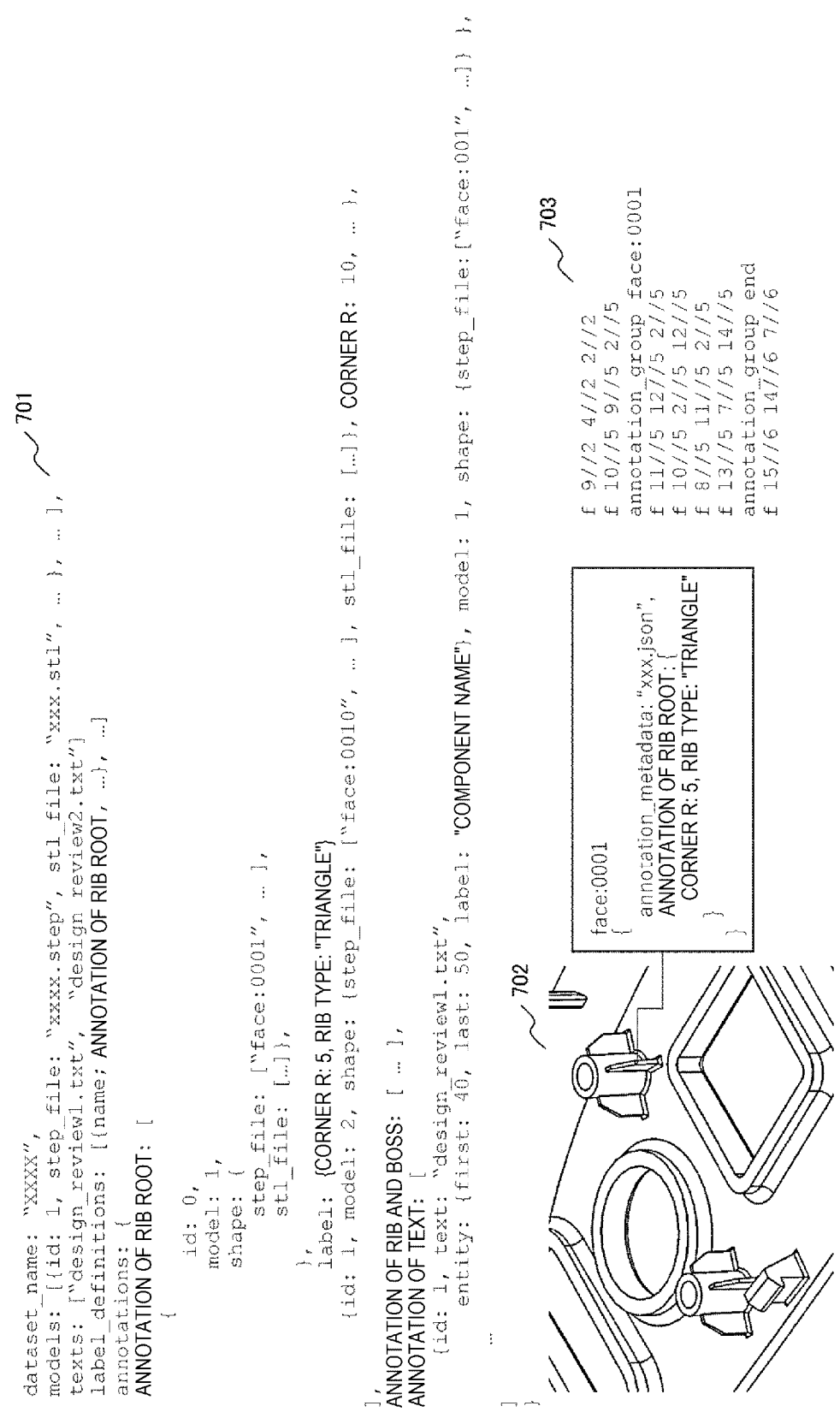

```
{
dataset_name: "XXXX",
models: [{id: 1, step_file: "xxxxx.step", stl_file: "xxx.stl", ... }, ... ],
texts: ["design review1.txt", "design review2.txt"]
label_definitions: [{name: ANNOTATION OF RIB ROOT, ...}, ...]
annotations:{
ANNOTATION OF RIB ROOT: [
    {
        id: 0,
        model: 1,
        shape: {
            step_file: ["face:0001", ... ],
            stl_file: [...]},
    },
    label: {CORNER R: 5, RIB TYPE: "TRIANGLE"}
    {id: 1, model: 2, shape: {step_file: ["face:0010", ... ], stl_file: [...]}, CORNER R: 10, ... },
],
ANNOTATION OF RIB AND BOSS: [ ... ],
ANNOTATION OF TEXT: [
    {id: 1, text: "design review1.txt",
        entity: {first: 40, last: 50, label: "COMPONENT NAME"}, model: 1, shape: {step_file:["face:001", ...]} },
    ...
]
}
}
```

701

702 face:0001
{
annotation_metadata: "xxx.json",
ANNOTATION OF RIB ROOT:{
CORNER R: 5, RIB TYPE: "TRIANGLE"
}

```
f 9//2 4//2 2//2
f 10//5 9//5 2//5
annotation_group face:0001
f 11//5 12//5 2//5
f 10//5 2//5 12//5
f 8//5 11//5 2//5
f 13//5 7//5 14//5
annotation_group end
f 15//6 14//6 7//6
```

703

[FIG. 8]
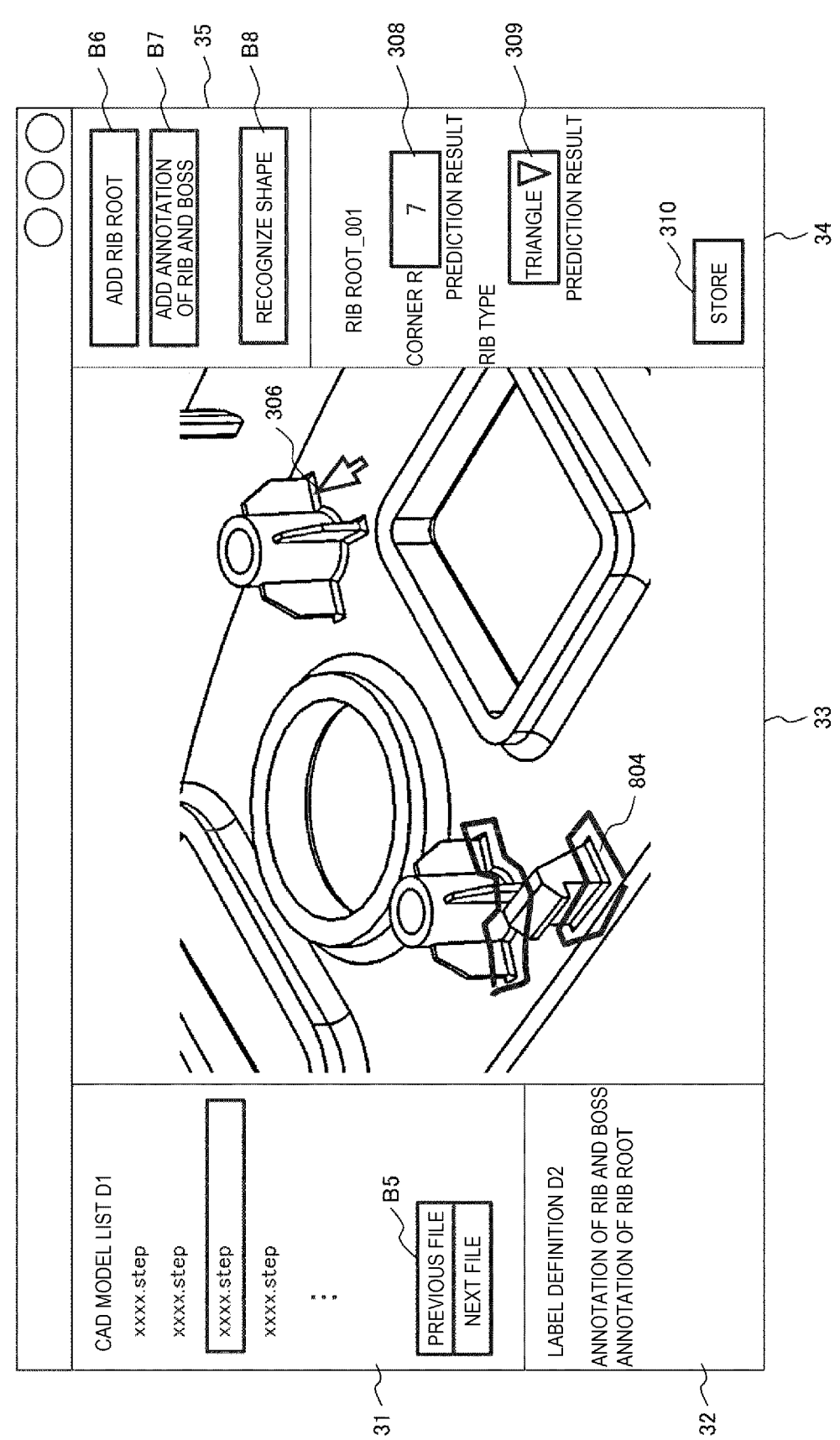

[FIG. 9]
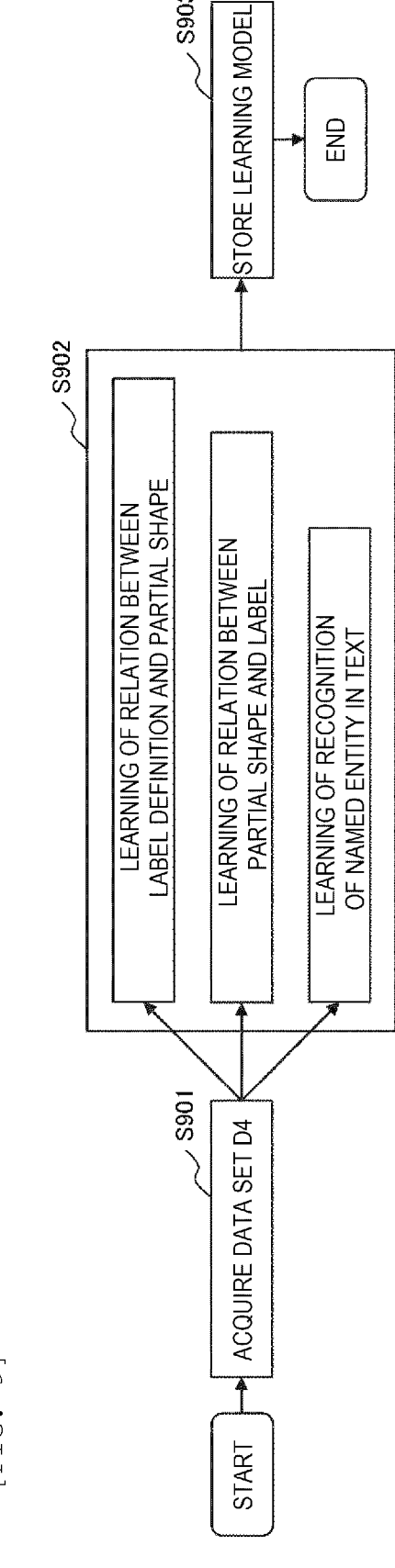

[FIG. 10]
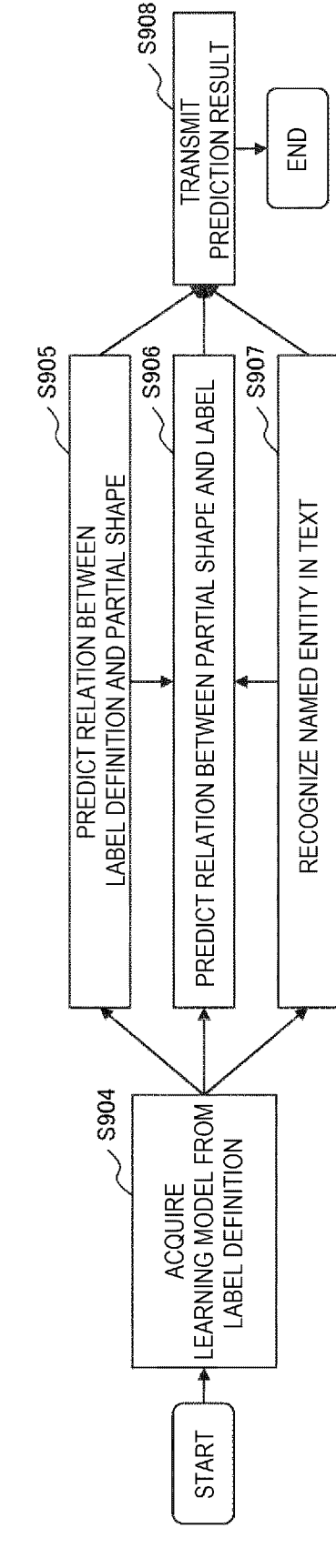

ANNOTATION DEVICE AND ANNOTATION METHOD

TECHNICAL FIELD

The present invention relates to an annotation device and an annotation method.

BACKGROUND Art

In product design, it is common to use a three-dimensional computer aided design (CAD). The three-dimensional CAD (hereinafter referred to as CAD) is a tool for creating a three-dimensional shape of a product on a computer by a technique including solid modeling or parametric modeling in accordance with an operation of a designer. In many CADs, the three-dimensional shape is expressed by boundray RE presentation (BREP) in which a solid, a surface, an edge, and a point of a shape and topology information thereof are described. Hereinafter, the three-dimensional shape created by CAD is referred to as a CAD model.

Patent Literature 1 is known as a technique for annotating the CAD model or a technique using annotation information on the CAD model.

Patent Literature 1 proposes a device that recognizes a label of a new shape using a data set of a predefined shape and a label and searches for a design rule related to the recognized label when a design rule that is a constraint on a CAD model derived from requirements, manufacturability, and the like of a product is determined based on the shape.

CITATION LIST

Patent Literature

PTL1: JP2020-95378A

SUMMARY OF INVENTION

Technical Problem

However, Patent Literature 1 has the following problems. Patent Literature 1 discloses a device that inputs the label to a base shape and performs the same labeling on the new shape obtained by deforming the label to improve an efficiency of labeling on a partial shape, but when the labeling is performed on a plurality of different CAD models, the labeling is not efficiently performed by the present device, and it is necessary to repeat an operation of opening the CAD model, manually selecting a partial shape, manually performing the labeling, and closing the CAD model, resulting in a problem that the number of steps is large.

In Patent Literature 1, an item name of the label and a format of a content thereof are fixed or embedded in the device, and the format cannot be changed externally. Meanwhile, in a general 3DA, the format of the label is not unified. In order to cope with various applications, it is required to perform unified annotations on a plurality of CAD models according to label definition information according to purposes. As an example of the application of the annotation, a data set of a pair of a CAD model partial shape and an annotation label may be used for machine learning or setting of a threshold for shape recognition. Therefore, a problem is to perform unified annotation according to a label format according to a purpose.

Further, what is handled in Patent Literature 1 is limited to annotations for labels. In the product design, a review text for a defect or the like of a CAD model designed at the time of design review or the like is created, and an instruction word or a partial shape of the CAD model is referred to in the text as shown in the drawing, but these are not associated with the data of the 3D CAD, and the referred partial shape needs to be manually found. Therefore, it is a problem to associate an expression in the text with the partial shape of the CAD model.

Patent Literature 1 does not refer to a storing method of an input annotation. The CAD model is often converted into a heterogeneous format such as an intermediate file or a mesh model, and information of the 3DA is lost at the time of conversion. In an application of visualization in a production site or the like, the CAD model is often converted into a surface mesh model. Therefore, even in the CAD model converted into the heterogeneous format, it is also a problem to maintain the information of the annotation, or to identify the partial shape of the heterogeneous format using the partial shape, which is annotated by the CAD model, as a key.

In view of the above, an object of the present invention is to provide an annotation device and method capable of simple and highly accurate annotation.

Solution to Problem

In view of the above, the present invention is "an annotation device for annotation to 3D shape data including: an input unit that inputs a 3D CAD model, a text, and label definition information; a calculation unit that generates an annotation data set through annotation processing; a storage unit that stores the generated annotation data set; and an output unit that outputs a processing result of the calculation unit, in which the calculation unit includes an annotation unit that obtains a partial shape of the 3D CAD model and annotation information including a label according to a named entity in the text or the label definition information, and a metadata generation unit that generates metadata that associates the annotation information with partial shapes of the 3D CAD model and heterogeneous format data derived from the 3D CAD model, and stores an annotation data set including the generated metadata, and a 3D CAD model and a text referenced by the metadata in the storage unit."

Advantageous Effects of Invention

According to the present invention, it is possible to provide an annotation device and an annotation method capable of simple and highly accurate annotation.

BRIEF DESCRIPTION OF DRAWINGS

FIG. 1 is a diagram showing a configuration example of an annotation device according to an embodiment of the present invention.

FIG. 2 is a diagram showing an example of a screen 20 for setting and inputting a CAD model to be annotated.

FIG. 3 is a diagram showing an example of an annotation screen 30 of the CAD model and a label value.

FIG. 4 is a diagram showing an example of an annotation screen 40 of the CAD model and a text.

FIG. 5 is a diagram showing an example of label definition data D2.

FIG. 6 is a diagram showing an example of a processing flow in an annotation metadata generation/association unit 17.

FIG. 7 is a diagram showing an example of an annotation embedded in metadata and a shape model.

FIG. 8 is a diagram showing an example of an annotation process using a recognition function.

FIG. 9 is a diagram showing an example of a learning processing flow of a shape/label/document feature recognition unit.

FIG. 10 is a diagram showing an example of an inference processing flow of the shape/label/document feature recognition unit.

DESCRIPTION OF EMBODIMENTS

Hereinafter, embodiments of the invention will be described with reference to the drawings.

In describing embodiments below, annotation refers to adding information (metadata) related to certain data as an annotation. An annotation 3DA in the three-dimensional CAD refers to information (metadata) relating to certain data (in this case, the CAD model), such as a text, a dimension, a tolerance, a welding symbol, and surface finishing related to a shape in the CAD model, and in the 3DA, it is possible to create, store, and display an annotation in CAD software in association with the shape in the CAD model. Information on the 3DA is stored together with CAD model information in a part output by CAD software or an assembly text. The 3DA is mainly used to describe product requirements, manufacturing requirements, and manufacturing instructions, and is said to promote automation of manufacturing procedures.

In other fields, attempts to annotate data are increasing. In particular, annotations for area definition and labeling of an image and a text are useful as learning data for recognition of the image and a language using the machine learning. For the annotations, annotation data is created primarily using an annotation tool, either manually or with assistance of programs such as the machine learning.

An annotation prepared as the learning data is characterized in that it is created based on an annotation format standard unified according to the purpose so that the same learning processing can be applied to many data. The annotated information is stored by describing annotation information and reference information to the image or the text in a file format including java script object notation (JSON). First Embodiment FIG. 1 is a configuration example of an annotation device according to an embodiment of the present invention. An annotation device 1 implemented by a computer includes an input unit 10, an output unit 15, an operation unit 16, an annotation metadata set storage unit 9, and a calculation unit 18. In addition, processing functions of the calculation unit 18 includes an annotation unit 14, an annotation metadata generation/association unit 17, and a shape/label/document feature recognition unit 19.

According to the annotation device 1 of FIG. 1, a CAD model set D1 to be annotated, label definition information D2 defining a label content to be annotated, and a text document D3 to be associated with a CAD model are input, an annotation screen is presented in accordance with these inputs, annotation data D4 is created based on a user operation, and new annotation data D4 is stored.

Specifically, first, various data are input by the input unit 10. In a CAD model set input unit 11 of the input unit 10, a plurality of CAD model sets D1 to be annotated are input. In a label definition information input unit 12, the label definition information D2 to be annotated is input. The label definition information D2 includes an identification name of a label definition, item names of a plurality of labels, a type of a label value, a value or a range allowed for the label value, a type (surface, edge, solid, or the like) of a geometric entity associated with the label, a type of a named entity of an annotation target text, and the like. A document input unit 13 inputs text information (document D3) of a text to be associated with the CAD model. Hereinafter, the named entity refers to a a a character string having a meaning obtained by extracting a part of the text.

Next, various processing functions of the calculation unit 18 will be described. First, in the annotation unit 14, with respect to a plurality of CAD model sets D1 input by the CAD model set input unit 11 and a plurality of texts (documents D3) input in the document input unit 13 as necessary, the label is annotated for a partial shape in the CAD model in accordance with a label defined by the label definition information D2 input by the label definition information input unit 12.

Here, the label is associated to the type value defined in the label definition information D2 for each of label items defined in the label definition information D2. In a case where one part of the text is to be annotated to the CAD partial shape, in accordance with the label definition information D2, a reference relation between the named entity in the classified text and the partial shape of the CAD is annotated as the label. The annotation unit 14 can generate a user interface that implements an operation of creating the annotation described above and interactively create an annotation based on the user operation.

In the annotation metadata generation/association unit 17 in the calculation unit 18, annotation data including the label, the CAD model, and the text, which is created by the annotation unit 14, is collected as annotation metadata D4 including the label information and reference information to the CAD model and the text. At the same time, information such as an identifier for associating the annotation metadata D4 with the partial shape is embedded in a format such as a 3D annotation or a mesh group in heterogeneous format data such as a CAD model to be annotated or a mesh model derived from the CAD model.

The annotation data set storage unit 9 stores the annotation metadata D4 generated by the annotation metadata generation/association unit 17 and the CAD model. The annotation metadata D4, the CAD model, the heterogeneous format data derived therefrom, and the text are collectively referred to as an annotation data set. A storage format includes a file, a document type database, an object storage, and the like. At the same time, the recognition unit 19 described later and the stored annotation data set can be read out to be used from the outside. A method for acquiring the annotation data set includes a query to a database and communication such as hypertext transfer protocol (HTTP).

The annotation data is often stored together with the 3D CAD model as additional information, but in the first embodiment of the present invention, the annotation data is stored in association with the annotation data set storage unit 9 on an annotation device side, not on a 3D CAD side. This facilitates handling when annotating a plurality of CAD models in association with one another.

The shape/label/document feature recognition unit 19 in the calculation unit 18 assists the annotation operation of the user in the annotation unit 14 by, for example, automatically predicting and recommending an annotation label to a CAD model shape selected by the user, by performing search of a similar shape, recognition of the named entity of the text, and prediction of the label from the shape using information of the annotation data set in the annotation data set storage unit 9.

The output unit 15 is an information processing device that presents the user interface described above to the user. The operation unit 16 is an input device such as a mouse, a touch panel, or a keyboard used when the user creates the annotation using the user interface described above.

In order to implement each function of the CAD model set input unit 11, the label definition information input unit 12, the document input unit 13, the annotation unit 14, the annotation metadata generation/association unit 17, the annotation shape/label/document feature recognition unit 19, and the annotation data set storage unit 9 of the annotation device 1 as a computer system, it is possible to apply a configuration including a single information processing device and software stored therein, a configuration including a network that connects a server that operates software in a place apart from the user and the output unit 15 and the operation unit 16 in a user operation terminal, or a configuration in which both are partially combined.

Next, screen configuration examples output to the output unit 15 will be described using FIGS. 2 to 4. First, FIG. 2 is an example of a screen 20 for setting and inputting a CAD model or the like to be annotated.

The setting and inputting screen 20 is divided into four small screens, and on a small screen 21, a data set name 207 and a storage destination 208 are displayed, and a button B1 for giving an instruction to start annotation when input settings are completed is arranged and displayed.

Small screens 22, 22, and 23 are screens for setting and inputting the CAD model set D1, the label definition information D2, and the document D3, respectively, and when the data set name 207 is designated, information D1, D2, and D3 corresponding to the data set name 207 is displayed, and by operating buttons B2, B3, and B4, information to be annotated is selected or added as appropriate from among the information, and is imported into the computer and processed.

On the small screen 22, a CAD model list D1 to be annotated is added by the user operation using the button B2.

On the small screen 23, the label definition information D2 of the annotation to the CAD model described above is added by the user operation using the button B3. The label definition information D2 used in the annotation is enabled or disabled by an operation of a check box. An example of the label definition information will be described later in FIG. 5. A method of adding the label definition information D2 includes a method according to a form of the user interface (no screen example), a method of inputting using a structured data format such as JSON, and the like.

On the small screen 24, a text file which is text information to be input to the document input unit 13 is added. The text file includes text data and more complicated rich text data.

When the operation of the start button B1 of the annotation is executed after the name and identifier name 207 of the data set and the storage destination location 208 of the data set are set on the small screen 21 on the inputting screen 20 of the overall configuration of FIG. 2, a transition is made to annotation screens 30 and 40 shown in FIGS. 3 and 4 for performing the annotation, and the input CAD model D1, the label definition information D2, and the text D3 are stored in the annotation data set storage unit 9.

For example, the display example of FIG. 2 shows an example in which a plurality of CAD models D1 are input, and a label in accordance with the label definition information D2 titled "ANNOTATION OF RIB ROOT" and "ANNOTATION OF RIB AND BOSS" is annotated to these CAD models.

FIG. 3 shows a screen configuration example 30 for a label annotation based on the label definition information D2 to the plurality of CAD models D1 in the annotation unit 14. The screen 30 also has a plurality of small area screen configurations. Left small areas 31 and 32 are selection screens of the CAD model D1 to be annotated and the label definition information D2, right small areas 34 and 35 are processing condition setting screens for the label definition information D2, and a central small area 33 is a CAD screen.

On the left portion 31 of this screen example, the CAD model D1 set in the CAD model set input unit 11 is displayed in a list, and the list can be selected according to the user operation of the button B5. By the operation of the button B5, the selected CAD model can be changed. In the label definition display area 32, a list of the label definition to be annotated is displayed. Here, the annotation of rib and boss and the annotation of rib root are displayed in a list, and of these, the fact that the annotation of rib root is the current target operation is displayed in bold and clarified.

On the right portion 35 of this screen example, when an add button B6 or B7 is pressed, annotation based on the label definition D2 selected in the present button B6 or B7 is started on the currently selected CAD model D1.

On the CAD model display portion 33 in the central portion of this screen example, a 3D model of the CAD model D1 selected in the CAD model list screen 31 is displayed. In the CAD model display portion 33, the partial shape (solid, surface, edge, point, or a plurality of combinations thereof) in the CAD model can be selected according to an operation by the operation unit 16 of FIG. 1.

In this screen example of FIG. 3, an example is shown in which a plurality of surfaces corresponding to the rib root are selected in the CAD model display portion 33 after "ADD RIB ROOT" is selected by the annotation addition button B6.

In the labeling portion 34 of this screen example, an item value of the label is input based on the label definition information on the selected CAD partial shape. An input area of the label item value is realized in a form of a text box 308, a drop down menu selection limb 309, or the like based on the information of the type of the label item value in the label definition information. When a storage button 310 is pressed, annotation information is generated by the annotation metadata generation/association unit based on the selected CAD model, the partial shape thereof, and the input label item value information, and is stored in the annotation data set storage unit.

FIG. 4 shows a screen 40 on which the annotation unit 14 performs annotation for a plurality of CAD models and a plurality of texts, associating the partial shape of the CAD model with the named entity in the text. The screen 40 also has a plurality of small area screen configurations. Left small areas 41 and 42 are selection screens of the CAD model D1 to be annotated and the text document D3, a right small area 43 is a processing condition setting screen for the text document D3, and a central small area 44 is a CAD screen. The left small area 41 is the same as the CAD model list D1 area 31 of FIG. 3 described above.

A text selection portion of the left small area 42 displays a name of the label definition information of the annotation targeting the text set by the label definition information input unit 12 and text data input by the document input unit 13. In a text list, the text data surrounded by a rectangular area is selected, and the text data to be selected can be switched by clicking a text name or clicking a button B8.

A text display portion of the right small area 43 displays the text selected by the text selection portion 42. By operating the text displayed here using the operation unit 16 in FIG. 1, a named entity 406 in the text can be selected. In FIG. 4, expressions such as "RIB ROOT" and "CORNER R IS SMALL" are selected by the selection operation. In a named entity label portion 407, for the named entity 406 selected and focused in the text display portion 43, a label for the named entity 406 defined in the label definition information D2 is set in 407.

In this example, the named entity 406 called "RIB ROOT" is selected from the drop down of a label called "COMPONENT NAME". The CAD display portion 44 displays the CAD model selected in the CAD model list D1 in the small area 41. When a partial shape 408 of the CAD model in the CAD display portion 44 is selected in a state where the named entity 406 is selected by the text display portion 43, an annotation associated with the selected partial shape 408 can be created on the selected named entity 406. The user creates an annotation while switching the CAD model list D1 and the text D3. It is also possible to annotate a plurality of CAD models in association with one text.

FIG. 5 shows an example of the label definition D2 input by the label definition information input unit 12. The expression of the label definition here is exemplified by JSON. A label example 501 is an example of a label definition having a name called "ANNOTATION OF RIB AND BOSS". A label definition name is input in a field of name, and a shape type (surface in this example) to be annotated is input in a field of target. Data in a key-value format in which the label item name is a key and the type of the label value is a value is input to a label definition field. In this example, for example, a label item called "shape type" is defined as a selection limb having a class such as a rib and a boss, a label item called "shape name" is defined as a character string (string), and a label item called "dimension" is defined as a floating decimal (float) having a value between 0 and 10.

A label definition example 502 is an example of a label definition having a name called "ANNOTATION OF RIB ROOT". As a difference between 501) described above, a field value of the shape (target) to be annotated is set to edge or surface (edges/surface). The shape type selected in the target (field) can be selected in the CAD model display portion 33 of FIG. 3.

A label definition example 503 is an example of a label definition having a name called "ANNOTATION OF TEXT". In this example, a character string (text) is set in the target field, and in this case, a screen (401 in FIG. 4) for annotating the text and the CAD model is displayed as the annotation screen. An entities filed stores a list of a classification class label of the named entity in the text. In this example, the named entity in the text is classified into two types "PART NAME" or "FAILURE CONTENT".

FIG. 6 is a flowchart of processing in the annotation metadata generation/association unit 17. First, in processing step S601, the plurality of CAD models D1, the label definition information D2, and the text D3 obtained by the input unit 10 are acquired. Next, in processing step S602, the label or the named entity in the text and the CAD model partial shape of the annotation created by the annotation unit 14 are acquired.

Next, in processing step S603, a unique identifier is issued to the CAD model partial shape included in the annotation. The identifier may be an ID issued by CAD software that creates the CAD model, an ID of a shape included in the CAD model, or a unique character string generated in the device.

Next, in processing step S604, the annotation metadata D4, which is data associating the label value created by the annotation unit 14 with the identifier of the CAD model partial shape, is created. The annotation metadata D4 is created in a text or binary format, and is created in a data format that can express a data structure in a dictionary format or a list format such as JSON, for example.

Next, in processing step S605, the 3D annotation of the identifier information is added to the partial shape in the CAD model in which the identifier is issued to the CAD model D1. At this time, not only the identifier information but also a storage location of the annotation data set, the label information created by the annotation unit 14, and the like may be included in the 3D annotation to be added. In addition, the CAD model is converted to create the heterogeneous format data such as a heterogeneous BREP, a surface mesh, a volume mesh, and a voxel format, and the above-described identifier of the CAD model partial shape is written to a partial shape such as a surface or a body in the heterogeneous format data. At this time, similarly, the label information other than the identifier may be embedded in the partial shape of the heterogeneous format data.

In the above processing, by adding the annotation data directly to the CAD model or the heterogeneous format data thereof after the conversion, it is possible to access and use the annotation information stored outside the model by referring to the annotation metadata from the CAD model data. In addition, by using the annotation metadata from the 3D annotation information of the CAD model, it is possible to know a portion corresponding to the partial shape of to be annotated in the heterogeneous format.

Finally, in processing step S606, the CAD model, the heterogeneous format data, and the annotation metadata subjected to the 3D annotation are stored in the storage destination designated in 208 of FIG. 2.

FIG. 7 shows an example of annotation metadata 701, a 3D annotation 702 to a CAD model, and an annotation 703 to the heterogeneous format data generated by converting the CAD model. An expression here is exemplified by JSON.

In the annotation metadata 701 of FIG. 7, the annotation data set is expressed in a structured data format such as JSON, and information on a name (data set) of the data set, a shape model (models), the text (text), the label definition (label_defininations), the annotation data (annotations) are stored at least.

In a field of the shape model (models), a plurality of pieces of information on a path to the storage destination to the CAD model or the heterogeneous format data obtained by converting the CAD model and an id of the shape model are stored. In this example, a CAD model whose file path is xxxx.step and a mesh model whose file path is xxx.stl are associated with a model whose id is 1.

In the text (texts), a list of references to the text used for annotation is stored. In this example, two texts of file paths called design_review1.txt and design review2.txt are designated as the annotation targets.

In the label definition (label_definitions), the label definition information shown in FIG. 5 is stored as a list. In the example, the same data as 501 in FIG. 5 is stored at the beginning of the list.

In the annotation data (annotations), the annotation information created by the annotation unit 14 is stored in a dictionary format or the like. In this example, data corresponding to three label definitions of annotation of rib root, annotation of rib and boss, and annotation of text is stored. In this example, as a first element of the list of the annotation of rib root, the id of the CAD model is 1 (model), and a label annotation in which a corner R is 5 and a rib type is triangle is made on a surface (shape) to which an identifier of face: 0001 in the CAD model is given. In addition, as a first annotation element of the list of the annotation of the text, a label (entity) referred to as a component name is set to the 40th to 50th characters of the text (text) design review1.txt, and annotation in which the id (model) of the CAD model is 1 and the identifier of the partial shape is surface (shape) of "face: 001" are associated with the label is stored.

The 3D annotation 702 written in the CAD model of FIG. 7 shows an example in which the identifier face: 0001 is 3D annotated together with related label information on a surface annotated by the annotation unit with respect to the CAD model xxxx.step and stored.

The heterogeneous format file example 703 obtained by converting the CAD model in FIG. 7 shows an example of annotations to the triangular mesh file and the mesh file obtained by converting the CAD model. In this example, a part of the mesh file is shown, and a line starting with f expresses a surface by combining three predefined vertex numbers and normal numbers. A line starting from annotation group indicates that a surface between which annotation_group appears next corresponds to face: 0001.

FIG. 8 shows an example in which the shape/label/document feature recognition unit 19 is used to assist the annotation operation in the annotation unit 14. FIG. 8 shows a screen configuration example at this time. This screen is basically the same screen configuration example as the configuration screen example 30 for performing the label annotation based on the label definition information D2 in FIG. 3, and is different in that the shape recognition button B8 is added to the small area 35, and prediction results are displayed in the text box 308 of the small area 34 and the selection limb 309 of the drop down menu.

The screen in FIG. 8 is used and displayed as follows. First, in this example, it is assumed that the user performs the annotation of rib root. The user first selects a partial shape 306 to be annotated in the small area 33 by clicking or touching. At this time, information on the selected partial shape 306 is transmitted to the recognition unit 19, and a predicted value of the label of the selected partial shape 306 is received from the recognition unit 19.

The received label predicted value is automatically input into the label input portion 308 of the small area 34 and displayed as a predicted result value, and these prediction results may be adopted as they are, or may be corrected by the user and added with annotation by operating the add button B6 of the rib root.

When the shape recognition button B8 is pressed, the entire CAD model and the label definition currently being created are transmitted to the recognition unit 19, the recognition unit 19 recognizes the shape, and a portion 804 predicted to correspond to the rib root in the CAD model is highlighted in the small area 33. Further, in response to this, when the user selects the highlighted portion 804, the selected partial shape can be edited. Similarly, the display of the label predicted value (the text box 308 of the small area 34) can be used in the highlighted portion 804, and the user can correct the label as necessary and register the label.

FIGS. 9 and 10 show flowcharts of processing of the shape/label/document feature recognition unit 19. The processing of the shape/label/document feature recognition unit 19 includes learning processing starting from S901 shown in FIG. 9 and inference processing starting from S904 shown in FIG. 10.

The learning processing shown in FIG. 9 is executed by batch processing or manually when a data set is created. In the learning processing, first, in first processing step S901, the annotation data set D4 stored in the storage unit 18 is read. This processing may be performed independently for each single data set, or preprocessing may be performed, such as merging data sets having the same label definition or selecting annotation data according to a certain criterion.

Next, in processing step S902, learning is performed using the acquired data set D4. The learning is performed from a plurality of aspects. One of the aspects of learning is learning of a relation between the label definition and the partial shape, and here, a problem of predicting the partial shape to which the label is to be given is learned based on the label definition information. In this learning, a rule-based program based on geometric calculation is set in advance, and parameters such as a threshold of geometric calculation are optimized so that a prediction error in a data set is minimized, or in machine learning or the like, a classification problem of a surface or a line of the CAD shape is classified and predicted for each partial shape using graph kernel learning, a graph neural net, or deep learning using mesh data or an negative function obtained by converting the CAD shape, a graph neural net for voxel data, convolution, or a Transformer.

A second aspect of learning is learning of a relation between the partial shape and the label, a selected partial shape is input, and a label corresponding thereto is output. About this prediction, a peripheral shape of the selected partial shape or the entire shape of the CAD model may be input as supplementary information. An analysis method is considered to be the same as the above-described learning, and a model for predicting the label value with respect to the partial shape for each of the label items is learned.

A third aspect of learning is learning of the named entity in the text, and here, a method using a corpus or a lock receiver, a rule base method, a prediction using a new net, or the like can be used, and learning is performed so that the named entity in the text designated by the label definition can be extracted and the label can be predicted.

The learning processing in the processing step S902 includes these three learning tasks, and these three learning tasks may be learned independently, or may be learned simultaneously using multitasking or transfer learning or end-to-end.

When the learning model described above can be learned, the information of the data set D4, the label definition of the data set, and the learning model are stored as a set in the processing step S903.

In the inference processing (recognition processing) of FIG. 10, in processing step S904, a learning model corresponding to the label definition of the annotation is acquired in accordance with a request from the annotation unit 14. Thereafter, when the prediction of the partial shape to be labeled is requested, the annotation unit 14 performs prediction using a learning model of the relation between the label definition and the partial shape in processing step S905, when the prediction of the label value is requested from the partial shape and the label definition information, the annotation unit 14 performs prediction by a learning model of the relation between the partial shape and the label in processing step S906, and when the recognition of the named entity in the text is requested, the annotation unit 14 performs prediction by a learning model of the recognition of the named entity in the text in processing step S907. In processing step S908, prediction results of these learning models are transmitted to the annotation unit 14.

According to the embodiment of the present invention, by defining and inputting the label definition information in advance, the annotation of the same format can be applied to the plurality of CAD models, and when the annotation information is used as a data set of the machine learning or another program, there is no inconsistency in the format or shaking of the label definition, and thus it is possible to perform collective processing on the annotation information. At the same time, compared to manual annotation, an input form and an input value according to the label definition information can be validated, and thus when the number of steps of the annotation is reduced, an input error of the annotation is reduced at the same time.

According to the embodiment of the present invention, by simultaneously inputting the plurality of CAD models, an operation of opening and closing the CAD model when the partial shape of the CAD model is annotated is omitted, and the number of steps of the annotation is reduced. By correcting an automatic annotation based on shape recognition, label recognition, or the like by the user in addition to the manual annotation, the number of steps for labeling and shape selection is reduced.

Further, according to the embodiment of the present invention, by performing the annotation associating the text and the CAD model partial shape, a design review text and the CAD model partial shape are associated with each other on the data, and a reference of the text from the CAD model and a reference of the partial shape from the text become possible.

According to the embodiment of the present invention, the data set is temporarily stored in a form having association with the plurality of CAD models, and it is easy to scan the annotation information and shape information of the plurality of CAD models in the data set. Furthermore, when the CAD model is converted into a heterogeneous format (heterogeneous CAD format, surface mesh, voxel, or the like), by centrally managing data before the conversion and data after the conversion, the annotation information is not lost even after the conversion and can be used.

REFERENCE SIGNS LIST

1: annotation device
10: input unit
11: CAD model set input unit
12: label definition information input unit
13: document input unit
14: annotation unit
15: output unit
16: operation unit
17: annotation metadata generation/association unit
18: calculation unit
19: shape/label/document feature recognition unit 19
9: annotation data set storage unit

The invention claimed is:

1. An annotation device for annotation to 3D shape data, the annotation device comprising:

an input unit configured to input a 3D CAD model, a text, and label definition information; a calculation unit configured to generate an annotation data set through annotation processing; a storage unit configured to store the generated annotation data set; and an output unit configured to output a predicted annotation label obtained by a recognition unit, wherein the calculation unit includes an annotation unit configured to obtain a partial shape of the 3D CAD model based on a selection range as one or more geometric entities of the 3D CAD model selected by the selection range, the geometric entities including at least one of a solid, a surface, an edge, and a point and annotation information including a label according to a named entity in the text or the label definition information, and a metadata generation unit configured to generate metadata that associates the annotation information with partial shapes of the 3D CAD model and heterogeneous format data derived from the 3D CAD model, and stores the annotation data set including the generated metadata, and the 3D CAD model and the text referenced by the metadata in the storage unit, wherein the annotation data set includes the label definition information, the calculation unit includes the recognition unit configured to learn a label annotation relation between the label definition information included in the annotation data set of the storage unit and a corresponding geometric shape and store a learning model, the recognition unit is configured to obtain the predicted annotation label for the partial shape obtained by the annotation unit in accordance with a request from the annotation unit, and the output unit is configured to output the predicted annotation label obtained by the recognition unit.

2. The annotation device according to claim 1, wherein the recognition unit is further configured to extract the text in the annotation data set of the storage unit and a named entity label included in the label definition information, learn to recognize the named entity in the text, recognize the learned named entity from the text read by the annotation unit in accordance with the request from the annotation unit, output a result to the output unit, and record the result in the storage unit.

3. The annotation device according to claim 1, wherein the recognition unit is further configured to learn the relation between the label definition information and a corresponding partial shape of the 3D CAD model, the relation indicating which partial shape of the 3D CAD model is selected with respect to the label definition information in the annotation data set of the storage unit and recommend a partial shape to be annotated for the label definition information in accordance with the request from the annotation unit.

4. The annotation device according to claim 1, wherein:

the metadata generation unit is configured to embed an identifier of a common partial shape into the metadata and the partial shapes of the 3D CAD model referenced by the generated metadata and heterogeneous format data derived from the 3D CAD model, wherein the common partial shape includes the partial shape of the 3D CAD model referenced by the generated metadata and a partial shape of the heterogeneous format data derived from the 3D CAD model corresponding to the partial shape of the 3D CAD model.

5. An annotation method for annotation to 3D shape data, the annotation method comprising:

inputting a CAD model and label definition information or a text by an input unit; selecting a label definition included in the label definition information to be annotated and selecting the CAD model and a partial shape in the CAD model by a calculation unit; and designating a label value or a named entity in the text from the selected partial shape by an operation unit based on a user operation, wherein the partial shape is one or more geometric entities of the CAD model selected by a selection range, the geometric entities including at least one of a solid, a surface, an edge, and a point, and the calculation unit is configured to store annotated information by generating metadata including the label definition information, the CAD model, the text, the label value, and information on an identifier of the partial shape of the CAD model, and embedding the identifier described in the metadata into the partial shape of the CAD model or heterogeneous format data obtained by converting the partial shape in 3DA or another format.

6. The annotation method according to claim 5, wherein when the partial shape of the CAD model is selected, the calculation unit displays a predicted label value corresponding to the label definition included in the label definition information based on the partial shape, corrects the predicted label value, or directly uses the predicted label value and adds an annotation.

7. The annotation method according to claim 5, wherein the calculation unit is configured to edit or use a selection range of a partial shape for each of a plurality of partial shapes in the CAD model that are annotation candidates recognized and calculated based on the label definition information, thereby selecting one of the plurality of partial shapes as the partial shape.

8. The annotation method according to claim 5, wherein the calculation unit is configured to perform an annotation operation for selecting the partial shape in the CAD model, the label definition included in the label definition information, and the text by, based on feature analysis of a data set that is already annotated, predicting the partial shape to be annotated in the CAD model, predicting the label value from the predicted partial shape, recognizing the named entity in the text, presenting a result of the recognition as an annotation result to a user, and correcting the annotation result by the user.

9. The annotation method according to claim 5, wherein the calculation unit is configured to perform annotation of the CAD model and the text by associating the named entity in the text labeled according to the label definition information with the partial shape of the CAD model.

* * * * *